United States Patent [19]

Woodin, Jr. et al.

[11] Patent Number: 5,276,411
[45] Date of Patent: Jan. 4, 1994

[54] HIGH POWER SOLID STATE PROGRAMMABLE LOAD

[75] Inventors: Charles E. Woodin, Jr., Littleton; David L. Wandrei, Sterling, both of Mass.

[73] Assignee: ATN Microwave, Inc., Billerica, Mass.

[21] Appl. No.: 898,204

[22] Filed: Jun. 1, 1992

[51] Int. Cl.$^5$ .............................. H01P 1/24
[52] U.S. Cl. .......................... 333/22 R; 333/116
[58] Field of Search . 333/103, 104, 109, 115-333/117; 333/262; 333/101; 333/263

[56] References Cited

U.S. PATENT DOCUMENTS

| | | |
|---|---|---|
| 3,454,906 | 7/1969 | Hyltin et al. |
| 3,559,108 | 1/1971 | Seidel ........................ 333/103 |
| 4,450,419 | 5/1984 | Schwarzmann ............... 333/164 |
| 4,764,740 | 8/1988 | Meyer ..................... 333/103 X |
| 4,939,485 | 7/1990 | Eisenberg .................... 333/104 |
| 5,034,708 | 7/1991 | Adamian et al. .............. 333/161 |
| 5,109,204 | 4/1992 | Keefer .................... 333/116 X |

OTHER PUBLICATIONS

Froelich, R., "Measurement of GaAs FET Noise Parameters", Watkins-Johnson Co., vol. 13, No. 6, Nov./Dec. 86, pp. 2-11.

Froelich R., "Automated Tuning for Noise Parameter Measurements Using a Microwave Probe", Watkins-Johnson Co., Mar. 1989, pp. 83-96.

Adamian, V., "Stable Source Aids Automated Noise-Parameter Measurements", The Time and Measurement Notebook, Feb., 1988, pp. 51-58.

*Primary Examiner*—Paul Gensler
*Attorney, Agent, or Firm*—Wolf, Greenfield & Sacks

[57] ABSTRACT

A high power solid state load comprises at least two arrays of solid state switching devices. The switching devices can comprise PIN diodes formed on a semi-conductor wafer. The arrays are connected to two ports of a combiner network and each of the switching devices in the arrays is driven either fully on or fully off in order to provide a load having high power handling capabilities and a large number of discrete impedance states.

2 Claims, 4 Drawing Sheets

HIGH POWER SOLID STATE PROGRAMMABLE LOAD

BACKGROUND OF THE INVENTION

1. Field of the Invention

The present invention relates generally to an electronic solid state programmable load and more particularly to a combining network for multiple PIN diode arrays having high power handling capabilities.

2. Background Description

It is desirable in the construction of microwave load dependent devices and circuits to provide a terminating load comprising a tuner, attenuator or phase shifter. Such loads allow measurements to be performed on the circuit. In this manner, noise-figure and gain circle data can be determined. The measurement of noise parameters utilizing an active load pull approach is discussed generally in Froelich, *Automated Tuning for Noise Parameter Measurements Using a Microwave Probe*, Microwave Journal, March, 1989, pp 83-96.

One form of tuner for providing a load to a circuit according to an active load pull approach is disclosed in U.S. Pat. No. 5,034,708, the teachings of which are expressly incorporated by reference herein. By providing an array of PIN diodes or similar solid state switching devices, a variable load can be constructed for use with a microwave load dependent device or circuit.

An array of PIN diodes can be adjusted to provide a desired load or impedance by providing a variable bias to predetermined of the diodes in the array so that the impedance of the predetermined diodes can be varied allowing the generation of a great number of desired impedance states for the overall array.

This type of diode array has disadvantages when used with high power circuits. "High power" in this instance means greater than 7 Watts. Traditionally, variable loads for such high power applications have been provided by means of a mechanical tuner that allows impedance to be varied by hand. Such mechanical tuners are, however, relatively slow and large. Mechanical tuners also tend to drift so that repeatability of measurements is difficult. For these reasons, mechanical tuners are not desirable for performing measurements of circuits formed on semi-conductor or similar wafers in which small size and high accuracy is necessary.

In view of the disadvantages of the prior art, this invention has as one object providing a high power solid state load for active load pull applications.

It is another object of this invention to provide a high power solid state load with variable impedance characteristics over a wide range of settings.

It is yet another object of this invention to provide a solid state load that is relatively small and capable of accurate repeatability of impedance measurement.

SUMMARY OF THE INVENTION

The foregoing and other objects and advantages of the invention are addressed by providing a solid state load having at least two arrays of solid state switching devices. In a preferred embodiment, the switching devices can comprise PIN diodes formed on a single semiconductor wafer. The switching devices are each driven into one of either a fully on or fully off state in order to prevent impedance changes in the diodes that could result from a high power voltage swing within the array. Hence, each array has effective high power handling capabilities. The arrays are connected to each of two ports of a combiner network in order to effect a phase change between each of the two arrays. Hence, a large number of discrete impedances can be generated despite the fact that each diode is driven into a fully on or fully off state. A variety of combiner networks can be utilized according to this invention. Such combiner networks include a 90° hybrid, a 180° hybrid and a directional coupler.

BRIEF DESCRIPTION OF THE DRAWING

Other and further features and advantages of the invention are illustrated through the accompanying drawings in which.

DETAILED DESCRIPTION

Figure 1:
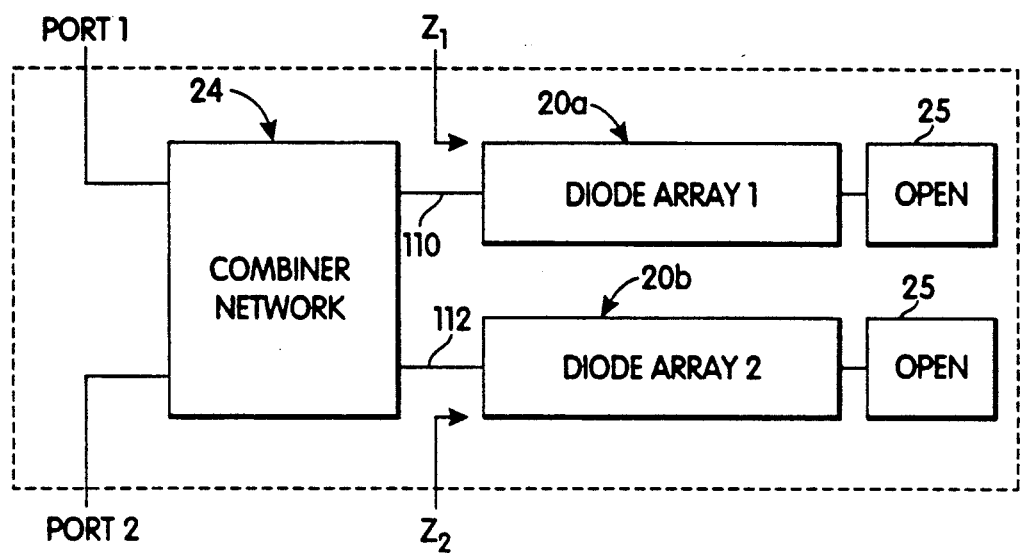
FIG. 1 is a schematic diagram of a high power solid state load according to this invention.

A solid state load according to this invention is detailed schematically in FIG. 1. As noted above, the use of a single solid state diode array 20 such as that shown in FIG. 2 allows for effective generation of a variety of impedances by altering the voltage states of given diodes in the array 20. This array comprises a series of diodes 1-15 and 46 interconnected to each other and having grounded capacitors 16-30 and 84 and an RF bypass network that includes respective shunt capacitors 84-99 and RF coils 68-83. All of the aforementioned array elements can be formed as part of a single semi-conductor wafer structure. Each diode is driven by applying a predetermined voltage to its respective input 52-67. In this embodiment of bias voltage of approximately 50 volts is preferred.

A DC bias current can be provided to the array at connection point 48 along the array via point 106 and RF bypass network 49 which includes RF coil 50 and shunt capacitor 51. The control circuitry for driving the diodes can be similar to that of above-described U.S. Pat. No. 5,034,708, except that the inputs 52-67 are driven fully on or off by the circuitry. Capacitors 100 and 101 can be placed at opposite ends of the array to prevent the DC bias current from exiting the array. RF coil 104 with shunt capacitor 105 comprise another RF bypass to prevent the input RF from interacting with the DC bias source.

The array 20 according to this embodiment comprises a number of diodes substantially directly connected to each other. However, with reference to the above-described U.S. Pat. No. 5,034,708, the diode array can also comprise diodes separated by predetermined lengths of connector media, such as microstrip transmission line. The physical lengths of the transmission line can be varied according to a numerical formula such as a prime number relationship or can be equal in length. Each of these types of array are contemplated according to this invention.

Figure 2:
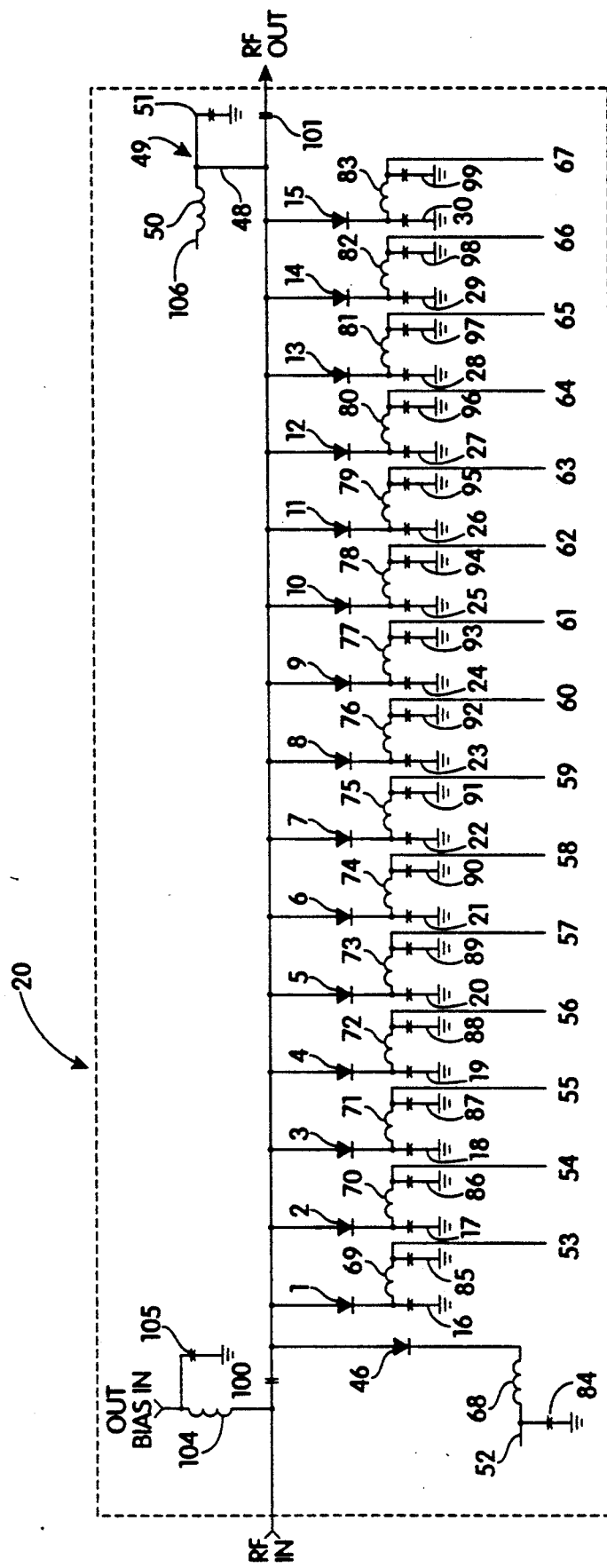
FIG. 2 is a more detailed schematic diagram of a diode array for use with solid state load of FIG. 1.

However, an array of diodes as shown in FIG. 2, comprising, for example, as PIN diodes, is not generally capable of handling power of more than approximately 7 Watts. Accordingly, the active load pull approach offered by a diode array has heretofore been unavailable for high power testing applications. Rather, less effective mechanical tuners have been utilized for high power applications.

In particular, a high power RF signal inputted into an array tends to vary the diode impedance from its DC quiescent point as the input RF voltage changes. Hence, the power handling capabilities of PIN diodes and similar solid state switching devices is limited.

The problem of diode power handling capacity during an RF voltage swing can be mitigated by driving each diode fully on or off by providing appropriate voltage or ground inputs at points 52–67 (FIG. 2). With only one array of diodes, however, the number of impedances available is greatly limited and, in general, equals $(n+1)^2$ where n is the number of diodes in the array. Thus, in order to obtain a large number of selectable impedances, one must construct a very long array of diodes. This becomes impractical, however.

This invention overcomes the disadvantages of a single diode array by providing a plurality of arrays linked by a combiner network. In this manner, a phase shift between the two arrays is effected to square the number of possible impedances. In a preferred embodiment, two diode arrays 20(a) and 20(b) of the type shown in FIG. 2 are connected via their RF inputs (RF IN) to each of two ports 110 and 112 of a combiner network 24.

In this example, PORT 1 of the combiner network 24 comprises an input port while PORT 2 comprises an output port. The arrays 20(a) and 20(b) are identical in this example and are connected to each of the two intermediate ports of the combiner network. The RF output of each array comprises an open circuit 25 in this example. Thus, the impedance presented at PORT 1 can be characterized by the following equation in which $Z_1$ is the impedance of the first diode array and $Z_2$ is the impedance of the second diode array:

$$Z_{port\ 1} = \tfrac{1}{2} \times (Z_1 e^{j\pi} + Z_2 e^{j0})$$

By utilizing a combiner network 24 according to this invention, the total number of impedances available for a pair of arrays having diodes driven either fully on or fully off, is the square of the number of diodes plus one in each of the diode arrays. For example, in a circuit having a pair of 24 diode arrays, the total number of impedance states equals 625. Thus, a fairly large number of high power handling impedances can be provided to a load according to FIG. 1.

Figure 3:
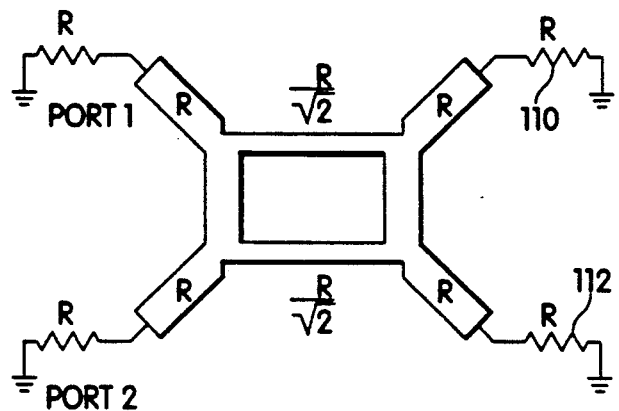
FIG. 3 is a schematic diagram of a combiner network for use with the solid state load of FIG. 1 according to one embodiment of this invention.
Figure 4:
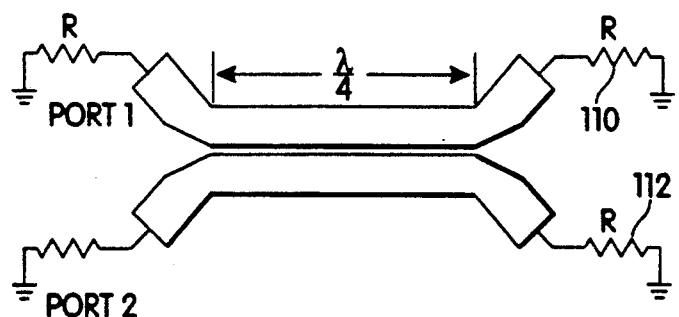
FIG. 4 is a schematic diagram of a combiner network according to an alternative embodiment of this invention.

The combiner network 24 of the preferred embodiment comprises any one of a number of known hybrid circuits. FIGS. 3 and 4 illustrate two possible alternative embodiments for a combiner network 24 according to this invention FIG. 3 represents a branch-line quadrature hybrid in microstrip or stripline form. This hybrid is also known as a 90° hybrid. Each of the branches in this hybrid are ¼ wavelength (λ/4) in length and characterized by resistance R. PORT 1 and PORT 2 are clearly illustrated.

FIG. 4 illustrates schematically an alternative combiner network comprising a coupled-line hybrid of a conventional type.

PORTS 1 and 2 and array input connection points 110 and 112 are shown. A preferred combiner network according to this invention comprises a 90° or quadrature hybrid as shown in FIG. 3. A 90° hybrid is preferred due to its low combining loss and equal signal split over multiple octave bandwidths. However, it is equally possible to utilize a 180° hybrid, a directional coupler or any other suitable solid state combiner network according to this invention.

Optimally, when using a 90° hybrid, an input at PORT 1 has a 0° phase change at the first array 20(a) signal at 110 and a 3 decibels reduction in power. Optimally, therefore, the signal at 112 at the second array 20(b) is 90° out of phase with the input at PORT 1 and reduced by 3 decibels relative to the PORT 1 input signal. The signal at PORT 2 should optimally remain in phase with that of PORT 1. However, any variation in phase can be eliminated by adjusting the relative impedance of each of the first and second diode arrays 20(a) and 20(b).

Figure 5:
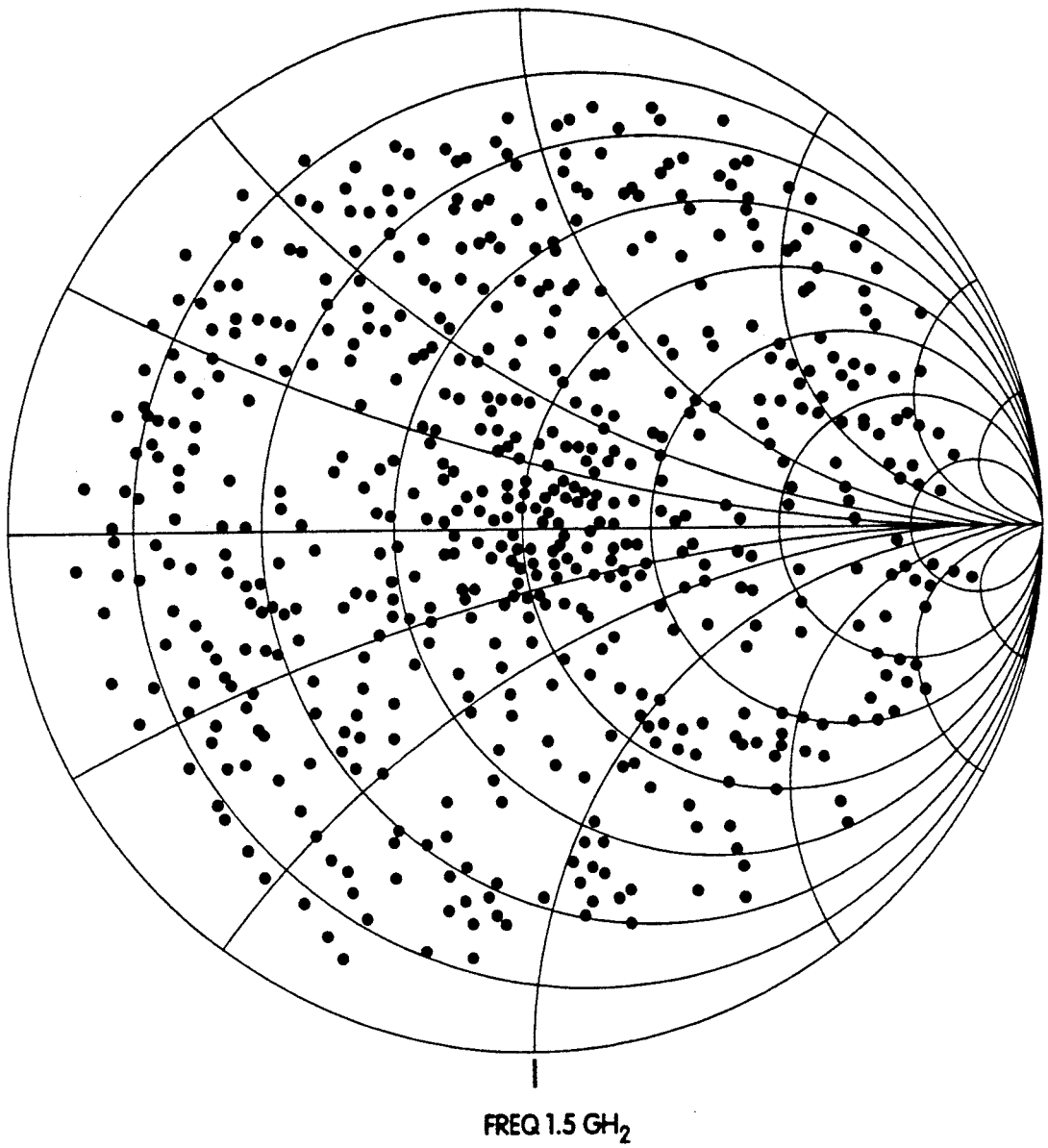
FIG. 5 is a Smith chart detailing the performance achieved from testing a circuit with a solid state load according to this invention.

Referring now to FIG. 5, the performance of the solid state load according to this invention is depicted graphically in the form of a Smith chart. Each of the points represents a reflection coefficient of the load. The measurements herein were made for a frequency range of 1–2 GHz. Note that a wide range and large field of reflection coefficients is obtained with the load according to this invention. Thus, this high power solid state load represents a versatile and reliable device for performing measurements on microwave devices.

While the foregoing invention has been described with reference to the preferred embodiments, variations and modifications will occur to those skilled in the art. This description, therefore, is meant to be taken only by way of example and not to otherwise limit the scope of the invention.

What is claimed is:

1. A high power load for providing a large number of distinct impedance states comprising:

a combiner network having at least four ports, the combiner network providing a first signal on a first port and a second signal on a second port, the first signal being substantially out of phase with respect to the second signal; and first and second variable impedance circuits respectively coupled to the first and second ports of the combiner network, each variable impedance network including an array of interconnected diodes, each diode coupled to a respective one of a plurality of input reference voltage lines, wherein each input reference voltage line is independently set to a reference voltage to drive each diode into either an on state or an off state;

wherein each variable impedance circuit further includes a plurality of grounded capacitors coupled to the array of diodes, and a plurality of RF bypass circuits coupled to the array of diodes, each RF bypass circuit including a shunt capacitor and an RF coil coupled to the shunt capacitor.

2. A high power load as recited in claim 1 wherein the on state includes a low loss, high current state and the off state includes a high back voltage, capacitive state.

* * * * *